United States Patent [19]

Trinh

[11] Patent Number: 5,128,629
[45] Date of Patent: Jul. 7, 1992

[54] METHOD FOR CONTROLLING THE OUTPUT POWER OF DIGITAL CELLULAR TELEPHONES

[75] Inventor: Lanh T. Trinh, Carlsbad, Calif.

[73] Assignee: Hughes Aircraft Company, Los Angeles, Calif.

[21] Appl. No.: 688,805

[22] Filed: Apr. 22, 1991

[51] Int. Cl.⁵ .............................................. H03G 3/20
[52] U.S. Cl. ................................... 330/129; 330/141; 330/145; 330/279; 330/281; 375/98; 455/126; 455/127
[58] Field of Search ............... 330/141, 145, 279, 281, 330/284, 127, 129; 375/98; 455/89, 116, 126, 127

[56] References Cited

U.S. PATENT DOCUMENTS

| | | | |
|---|---|---|---|
| 4,412,337 | 10/1983 | Bickley et al. | 455/126 X |
| 4,592,073 | 5/1986 | Watanabe | 455/126 X |
| 4,757,502 | 7/1988 | Meuriche et al. | 375/98 X |
| 5,054,116 | 10/1991 | Davidson | 455/126 |

FOREIGN PATENT DOCUMENTS

| | | | |
|---|---|---|---|
| 156206 | 9/1983 | Japan | 330/279 |
| 181832 | 10/1984 | Japan | 455/116 |

*Primary Examiner*—James B. Mullins
*Attorney, Agent, or Firm*—Gordon R. Lindeen, III; Steven M. Mitchell; Wanda K. Denson-Low

[57] ABSTRACT

A controlled power amplifier system (211) wherein a sample (225) of the output power level of an on/off switched power amplifier (215) is compared with a reference signal (227) to produce a power level control signal (275) that controls the output power level of the power amplifier (215). When the power amplifier (215) is switched off, the control signal (275) is maintained at the level it had just prior to the transition from an on to an off state. The switching is performed offset from the ends of each switched power amplifier pulse envelope to allow the pulse amplitude to be leveled in the center of the pulse and yet allow the pulse rise and fall times of the pulse envelope to follow the power amplifier input.

15 Claims, 5 Drawing Sheets

METHOD FOR CONTROLLING THE OUTPUT POWER OF DIGITAL CELLULAR TELEPHONES

BACKGROUND

The present invention relates generally to power amplifier circuits, and more particularly to power amplifier circuits that are controlled to maintain a desired constant output power level in burst mode operations. Of special interest is the use of the present invention in controlling the output power of digital cellular telephones.

The prior art techniques used in continuously transmitting power amplifiers found in present FM cellular systems are inadequate for burst mode digital transmissions found in the new standard for cellular telephone units. The prior art techniques may cause overshoots of RF power to appear at the output of the power amplifier at the start of a transmit burst.

In a conventional power amplifier used in cellular telephone service, there is included a control loop typically comprising a power amplifier under control, a power detector with an associated conditioning circuit that generate a DC voltage proportional to the output power of the amplifier, and a voltage comparator that compares the feedback voltage from the power detector to that of an input control voltage from a controller. A loop filter tailors the response of the control loop to assure loop stability as well as other loop characteristics, such as loop damping and responsiveness.

The difference between the control input voltage and the feedback voltage is an error voltage or signal. The error signal is used to drive the power amplifier biasing circuit or an attenuator placed at the input or output of the amplifier. This closed-loop control circuit acts in such a way as to force a null condition to exist in the comparator, so that the input control voltage equals the feedback voltage. The overall purpose of the power amplifier output control loop is to reference the output power to a known power detector in order to avoid output power variations due to changes in temperatures and supply voltages. The controller typically contains a lookup table for the power detector voltages as a function of the true output level of the power amplifier.

Operationally, as the cellular telephone unit enters a cell site to place a phone call, the base station directs the telephone unit to output a specified RF level. This level must be held to within some predetermined tolerance regardless of disturbances such as changes in battery voltages and temperature, and the like. The above-described conventional circuitry is inadequate for cellular telephone service made to meet newer, burst mode, standards.

The problem with the prior art control technique lies in the fact that under the newer standard, the RF transmission is not continuous as in an analog FM system. Under the new standard, transmissions are time division multiplexed, in that the amplifier is controlled to output RF energy only a portion of the time, and the rest of the time period is dedicated to receive functions. During the receive portion of the period, the amplifier is normally shut off.

This transmit-receive-transmit pattern repeats for the duration of the phone conversation. If the conventional technique is used for controlling the power amplifier operating in a burst mode scenario as above-described, there will be no output power during the receive period and the power detector would indicate zero power, while the input control voltage is still set for the desired output power.

Therefore, during the transmitter off period, the loop is open and the comparator sees two unequal input voltages so it will try to swing towards the high voltage end. Then, as the amplifier is switched on for the transmit burst, the high voltage condition that exists in the comparator/loop filter will cause the amplifier to output maximum power momentarily before the loop can correct itself back to equilibrium, causing the power overshoots mentioned above. From this condition it should be obvious that a new controlled power amplifier system that prevents the transient problem would constitute an important advancement in the art.

SUMMARY OF THE INVENTION

A novel feature of the present invention resides in the use of a track and hold circuit within the control loop of the output power level control circuitry of a transmitter power amplifier used in a digital cellular telephone. In this digital cellular telephone application, transmissions are in a burst mode, unlike the continuous transmissions found in an analog FM application. The circuit of the present invention provides a means for controlling the output power of the digital cellular telephone. The present circuit is basic, simple and inexpensive to implement.

The purpose of the present invention is to suppress power transients or overshoots that occur at the output of a controlled power amplifier. The standard circuits used for controlling continuously transmitting amplifiers, such as ones used in FM cellular phones, cause power overshoots to appear at the start of each transmit burst in the digital cellular telephone format. The present circuit also accommodates the analog FM mode when used in the dual-mode cellular unit.

Central to the present invention is the use of the track and hold circuit inserted in the transmitter control loop. During the transmit burst, the track and hold circuit is transparent (track mode) and the loop is closed normally. As the transmitter shuts off output power at the end of the burst, the track and hold circuit is switched to the hold mode and stays in the hold mode until the next transmit burst. During the hold cycle, the track and hold circuit retains the loop information from the last transmit time and provides a smooth control transition to the next transmit time. As a result, output power overshoots are prevented.

The track-to-hold transition occurs slightly before the amplifier is shut off in order to preserve the loop information. The hold-to-track transition occurs slightly after the amplifier is turned back on. When a dual mode cellular unit (one capable of operating both the digital cellular standard and the analog FM standard) operates in the analog FM mode, the track and hold is permanently kept in track mode (transparent).

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
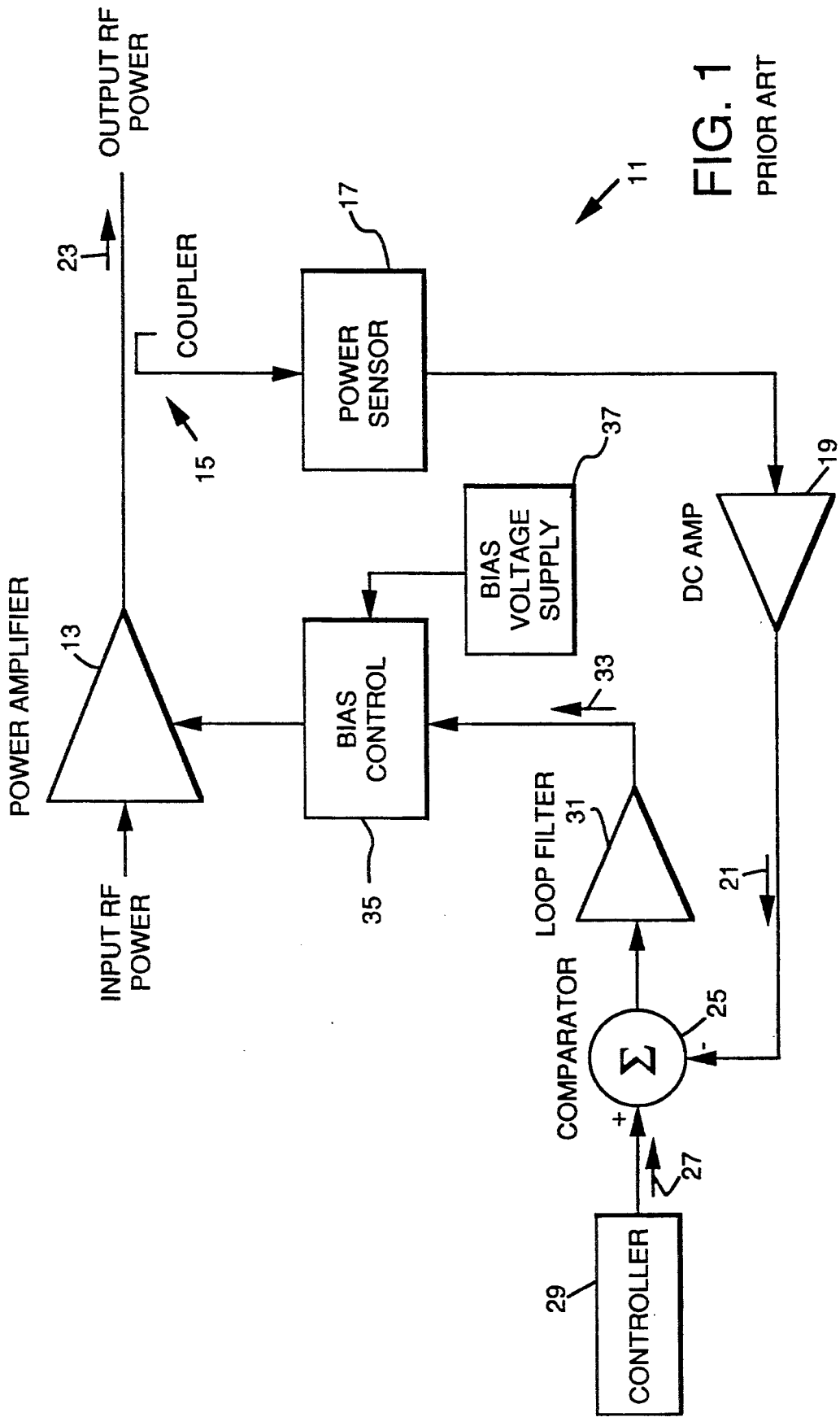
FIG. 1 shows a conventional transmitter power amplifier control circuit, herein designated "PRIOR ART"

As shown in FIG. 1 a conventional power control circuit 11 is typically comprised of the power amplifier 13 under control, an output power sampler or coupler 15 and a power detector 17, or power meter, that usually comprises a diode rectifier, an associated conditioning circuit 19 that generate a DC voltage, represented by arrow 21, proportional to the output power 23 of the amplifier, and a voltage comparator 25 that compares the feedback voltage 21 from the power sensor to that of an input control voltage 27. The input control voltage typically comes from a digital controller 29. A loop filter 31 tailors the response of the control loop to assure loop stability as well as other loop characteristics including loop damping and responsiveness.

The difference between the control input voltage 27 and the feedback voltage 21 is an error voltage 33. This error voltage is used to drive an amplifier biasing circuit 35 with a bias voltage supply 37 or an attenuator placed at the input or output of the amplifier 13. The system loop is a closed loop control unit and acts in such a way as to force a null condition to exist in the comparator 25, such that the input control voltage 27 equals the feedback voltage 21.

The overall purpose of the power amplifier output control loop is to reference the output power to a known power detector in order to avoid output power variations due to changes in temperatures and supply voltages. The controller 29 typically contains a lookup table for the power sensor voltages as a function of the true output level of the power amplifier.

Figure 2:
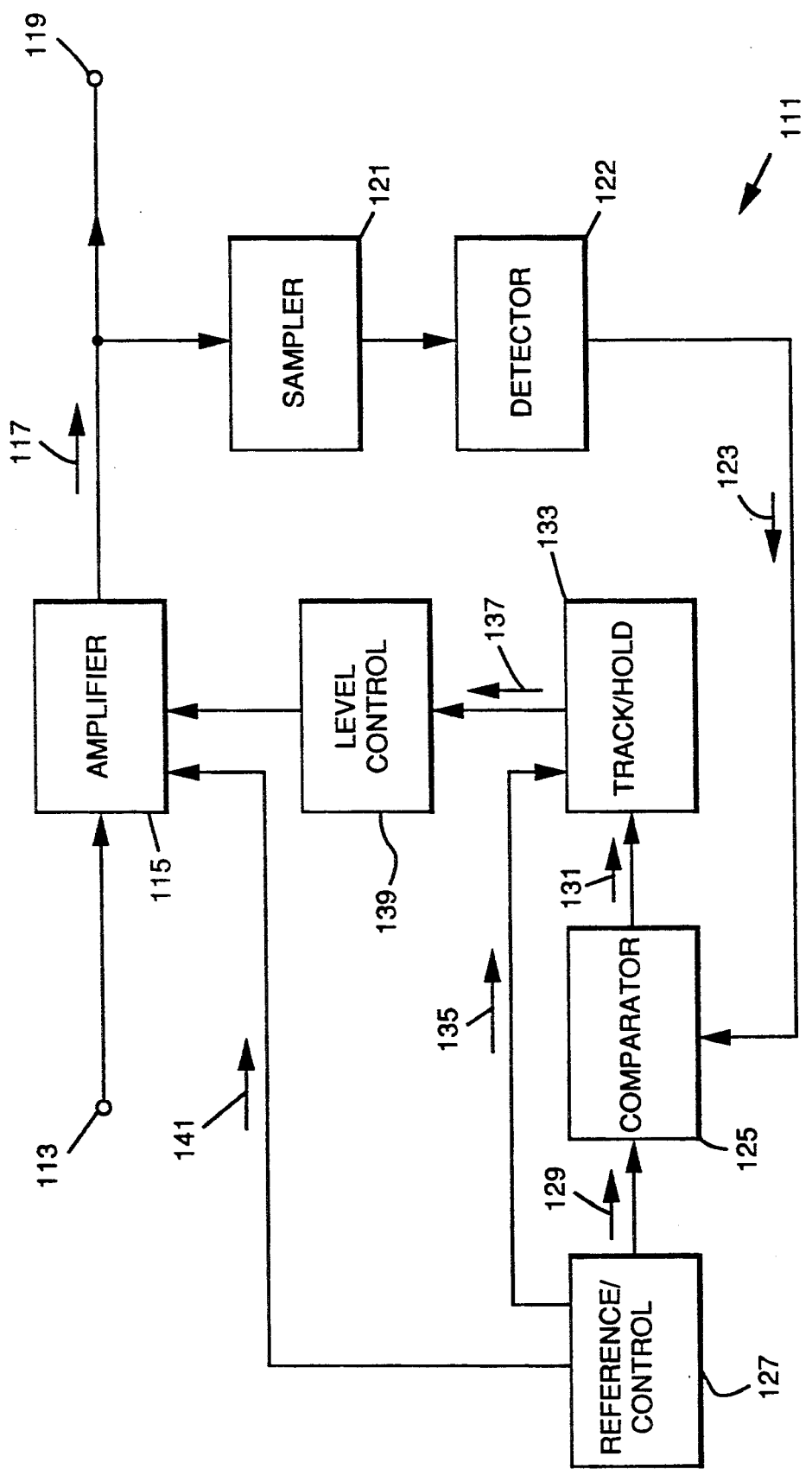
FIG. 2 is a block diagram of the present invention.

Referring now to the block diagram of FIG. 2, there is shown a controlled power amplifier system 111 according to an embodiment of the present invention. RF energy is introduced to an input terminal 113 coupled to a controlled RF amplifier 115 that provides an amplified RF signal, herein represented by arrow 117, to an output terminal 119. Coupled to the output of the amplifier 115 are sampler 121 and signal sensor 122 that provide a power level signal 123 to one input of a comparator 125. Another input of the comparator 125 is coupled to a reference/controller 127 that provides to the comparator a reference signal 129 for comparison with the power level signal 123 to produce an error signal 131 at an output of the comparator 125.

Unlike the prior art, the error signal is coupled to a track/hold circuit 133 that is controlled by a track/hold control signal 135 from the reference/controller 127, and which output 137 is coupled to a power amplifier level control circuit 139 that is, in turn, coupled to the amplifier 115 or to a conventional RF energy attenuator (not shown) at either the input or output of the amplifier. In the system 111, a transmitter control loop is defined by the amplifier 115, the sensor 122, the comparator 125, the track/hold circuit 133, and the power level control circuit 139.

Central to the present invention is the use of the track and hold circuit 133 inserted in the transmitter control loop. During the transmit burst (controlled by the reference/controller 127 through a transmit control signal 141), the track and hold circuit is transparent (track mode) and the loop is closed normally. As the transmitter 115 shuts off output power at the end of the burst, the track and hold circuit is switched to the hold mode (by the controller 127) and stays in the hold mode unitl the next transmit burst. During the hold cycle, the track and hold circuit 133 retains the loop information from a previous transmit time and provides a smooth control transition to the next transmit time. As a result, output power transients are prevented. The track to hold transition occurs slightly before the amplifier is shut off in order to preserve the loop information.

Figure 3:
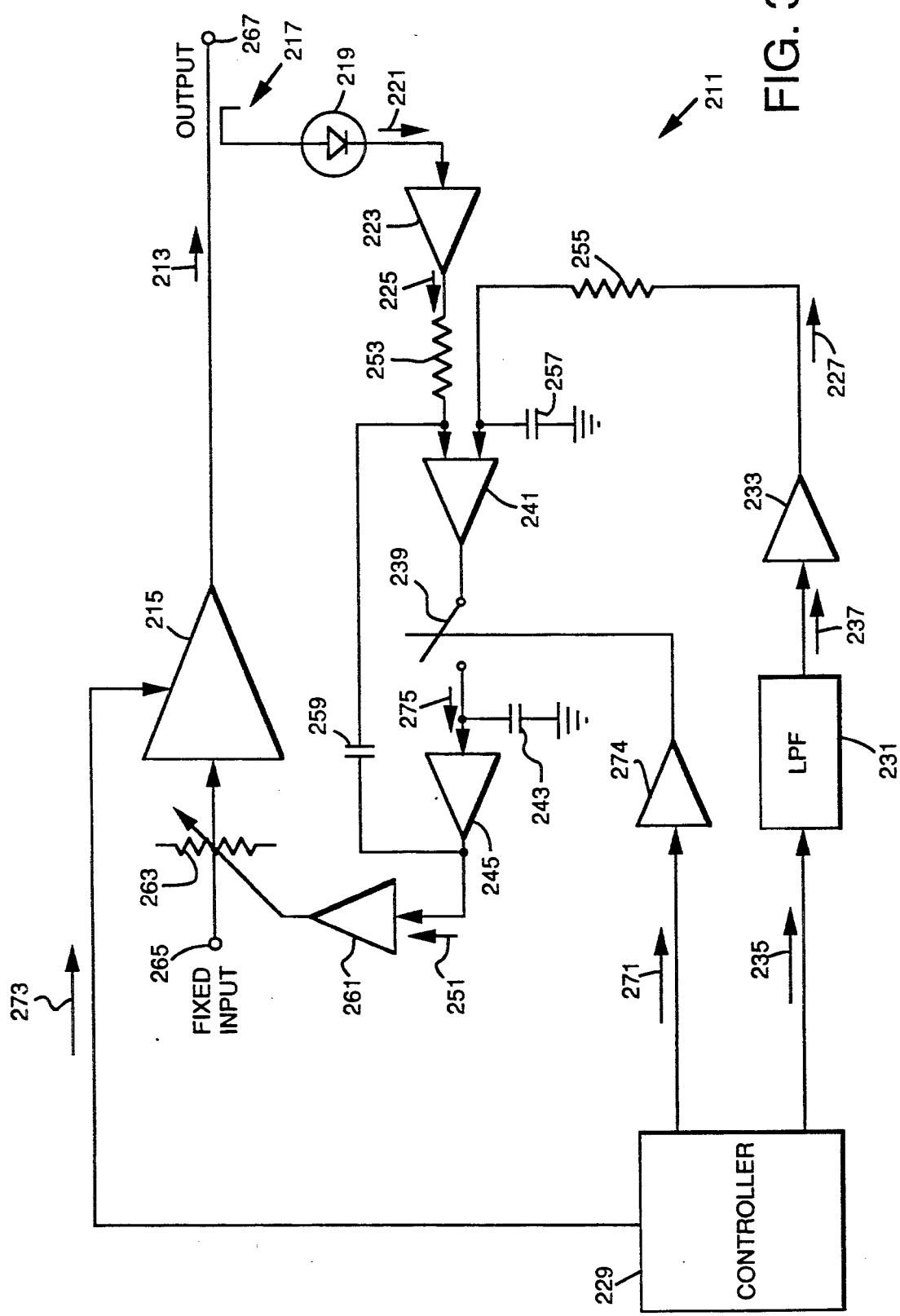
FIG. 3 shows a transmitter power amplifier control circuit of a controlled power amplifier system in accordance with the principles of the present invention.
Figure 4:
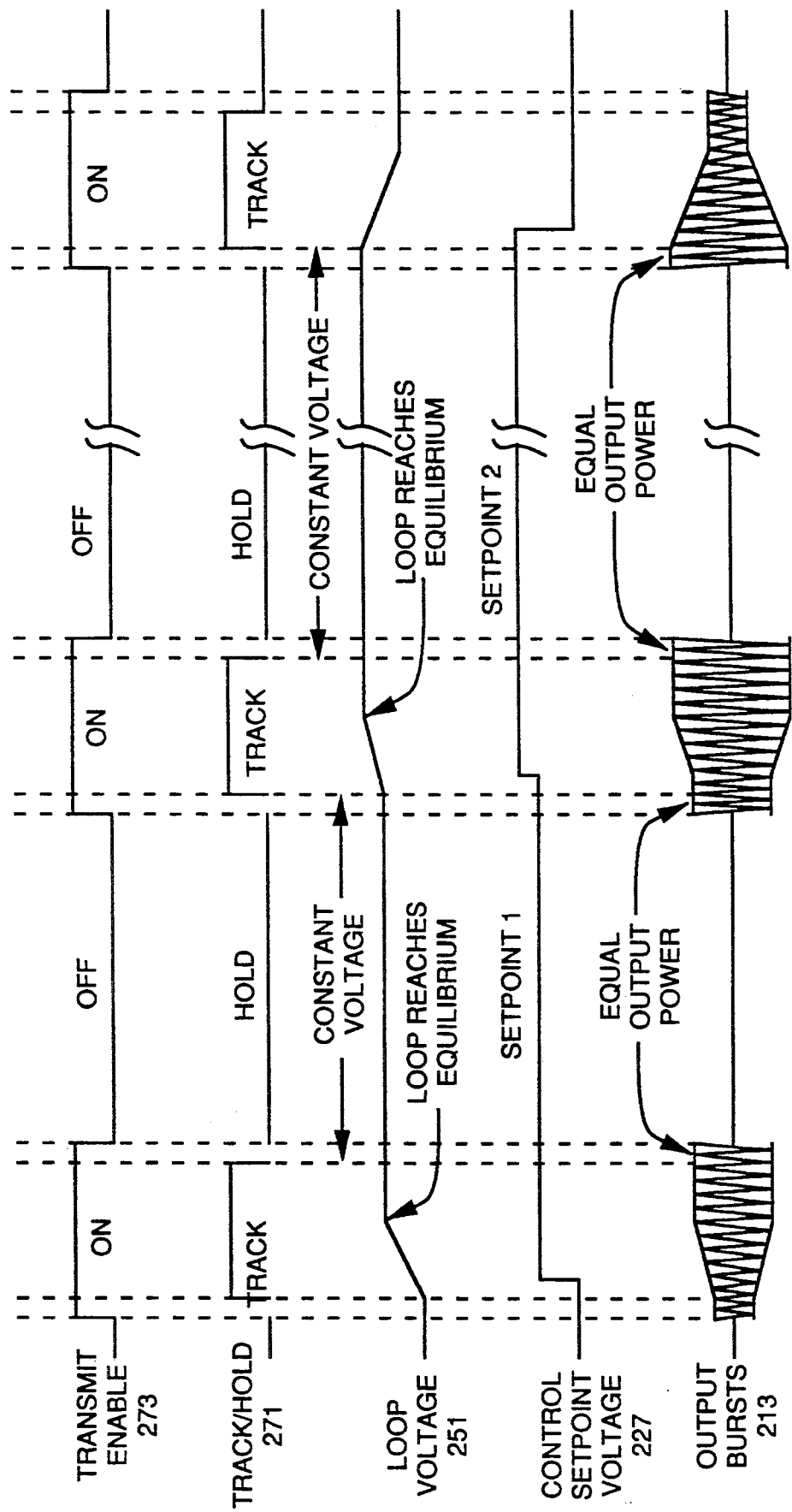
FIG. 4 shows timing waveforms for the circuit of FIG. 3.

The hold to track transition occurs slightly after the amplifier is turned back on. When a dual mode cellular unit (one capable of operating both the digital cellular standard and the analog FM standard) operates in the analog FM mode, the track and hold is permanently kept in track mode (transparent). A particular embodiment 211 of the invention is illustrated in FIG. 3, with waveforms shown in FIG. 4. Here, the output (arrow 213) of a power amplifier 215 is sampled by a coupler 217 and detected by a power detector 219 whose output 221 is then ranged and scaled by operational amplifier 223 so that its output voltage 225 is the same in range and scale as a setpoint voltage 227 generated by a controller 229.

The setpoint voltage 227 represents the desired output power setting of the power amplifier 215 being controlled. The voltage 227 is set by controller 229 by means of a low pass filter 231 and buffer 233. The controller outputs a pulsewidth modulated (PWM) waveform 235 whose duty cycle is proportional to the control voltage 227. The low pass filter 231 removes the AC component from the PWM waveform 235 leaving a DC voltage component 237 which is then buffered by the amplifier 233 to become the setpoint control voltage 227. The low pass filter 231 and buffer amplifier 233 form essentially a digital-to-analog converter.

When the control system 211 is in the track mode, an electronic switch 239 is electronically closed and the circuit block consisting of a comparator amplifier 241, switch 239, a hold capacitor 243 and buffer amplifier 245 can be considered a single unit which acts like a single comparator amplifier. As such, it will amplify the difference between the feedback voltage 221 (the power-indicating voltage) and the setpoint voltage 227 (set by the controller 229). The difference voltage 251 will ramp up or down (depending whether the difference is negative or positive) until the point where the loop reaches the equilibrium state at which time the feedback voltage 221 is exactly equal to the setpoint voltage 227.

The rate at which the voltage 251 ramps up or down is determined by the time constant set by resistors 253, 255 and capacitors 257 and 259. The difference voltage 251 is used to drive the current driver 261 which will alter the amount of attenuation in an conventional RF attenuator 263. The amount of attenuation (negative gain) plus the gain of the power amplifier 215 equal the overall gain of the system from input 265 to output 267. When the system is in a closed loop as described above, the output power 213 will stay directly proportional to the control setpoint 227 established by the controller 229, in spite of gain variation in power amplifier 215 due to production tolerances as well as physical disturbances like temperature variations and supply voltage fluctuations.

When the system 211 goes to the hold mode, just prior to the end of the "transmit on" time, the controller 229 will change the logic state of a track/hold signal 271 which directs a driver amplifier 274 to open the switch 239. When switch 239 is opened, the capacitor 243 will hold the value of a loop voltage 275 at the instant the switch is opened and maintains this value constant during the entire hold time since it is not charged or discharged by the amplifier 241 during this time. The constant voltage held in capacitor 243 acts as a form of memory that remembers the attenuator setting from the last transmit on period, so when the power amplifier 215 is switched on by a transmit enable signal 273 from the controller 229 for the next transmit burst, it will initially have the same output power as at the end of the last transmit on time, and then resumes tracking the control setpoint voltage.

Figure 5:
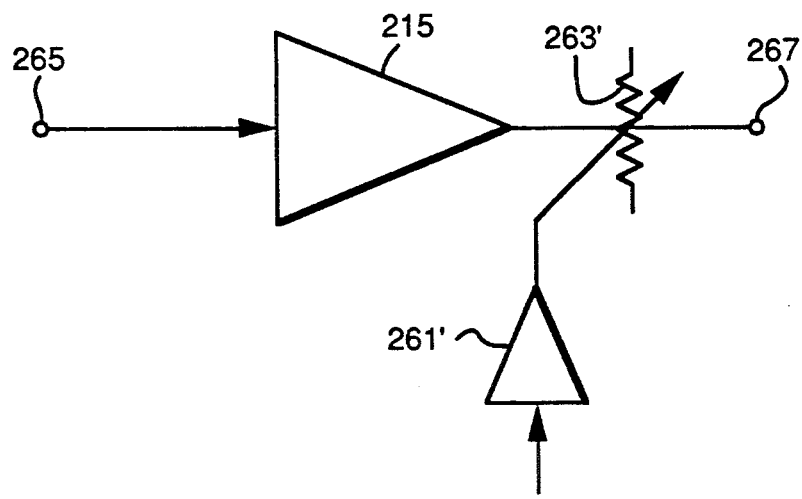
FIG. 5 shows an alternative RF attenuator for use in the amplifier of FIG. 3.
Figure 6:
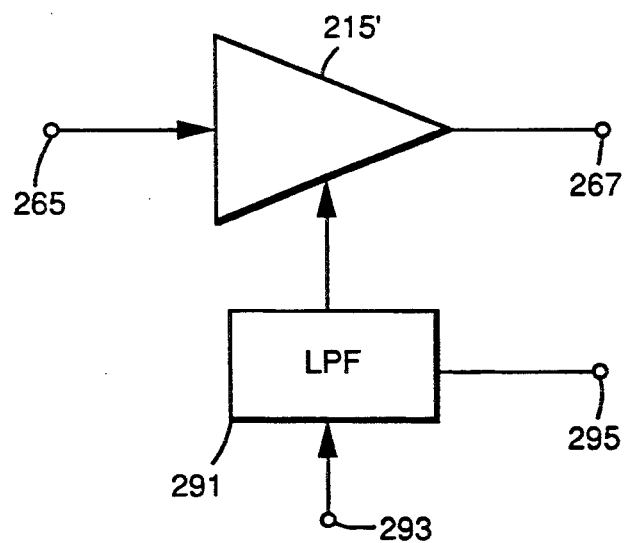
FIG. 6 shows an alternative power level control circuit for use in the amplifier of FIG. 3.

An alternative RF attenuator 263' may be placed in the output of the amplifier 215, as shown in FIG. 5. Also, the power level of the amplifier 215 may be controlled by a conventional power control circuit 291 that has an error signal input terminal 293, and a bias supply voltage input terminal 295, as illustrated in FIG. 6.

Thus there has been described a new and improved method and circuit for controlling the output power of digital cellular telephones. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A controlled power amplifier system comprising:
   a power amplifier for producing an amplified power output signal;
   an output sampler in communication with the amplified power output signal for producing a power level signal representative of the amplified power output signal power level;
   a comparator for comparing the power level signal to a reference power level and producing an error signal in response thereto;
   a power level controller in communication with the comparator for alternately tracking the error signal in a tracking mode and holding a received error signal in a hold mode, the controller also controlling the amplified power output signal power level in response to the tracked or held error signal respectively;
   a system controller for switching the power amplifier between an active state and an inactive state; and
   a track/hold circuit in communication with the system controller for detecting when the power amplifier is switched between the active and inactive states and in communication with the power level controller for switching the power level controller between the tracking mode and the hold mode, the circuit switching the power level controller to the tracking mode at a first predetermined time interval after the power amplifier is switched to the active state and switching the power level controller to the hold mode at a second predetermined time interval before the power amplifier is switched to the inactive state.

2. The system of claim 1 wherein the first predetermined time interval is longer than the rise time of the amplified power output signal.

3. The system of claim 2 wherein the sampler comprises a power detector for detecting the power in the coupler and producing an output in response thereto; and
   an operational amplifier coupled to the detector output for ranging and scaling the detector output to the reference power level.

4. The system of claim 3 wherein the track/hold circuit comprises a memory device coupled to the electronic switch for holding a received error signal.

5. The system of claim 1 wherein the second predetermined time interval is longer than the fall time of the amplified power output signal.

6. The system of claim 1 wherein the sampler comprises an RF coupler coupled to the output of the power amplifier for sensing the amplified power output signal level.

7. The system of claim 1 comprising a digital-to-analog converter for converting a pulse width modulation waveform to produce a signal representative of the reference power level and for supplying the signal to the comparator as the reference power level.

8. The system of claim 1 wherein the track/hold circuit comprises an electronic on/off switch disposed in series between the comparator and the power level controller, the switch being operated by the system controller.

9. The system of claim 1 wherein the power level controller comprises a power attenuator for attenuating the input to the power amplifier and thereby controlling the amplified power output signal level.

10. The system of claim 1 wherein the power level controller controls the bias voltage supply level to the power amplifier to thereby control the amplified power output level.

11. A method for controlling the output level of a power amplifier which is switched between active and inactive states comprising:
    sampling the power amplifier output signal and producing a power level signal representative of the power amplifier output signal power level;
    comparing the power level signal to a reference power level and producing an error signal in response thereto;
    alternately tracking the error signal in a tracking mode and holding a received error signal in a hold mode of a power level controller and controlling the power amplifier output signal power level in response to the tracked or held error signal respectively;
    detecting when the power amplifier is switched between the active and inactive states and switching the power level controller between the tracking mode and the hold mode, the switching of the power level controller to the tracking mode being done at a first predetermined time interval after the power amplifier is switched to the active state and the switching of the power level controller to the hold mode being done at a second predetermined time interval before the power amplifier is switched to the inactive state.

12. The method of claim 11 wherein the step of switching of the power level controller to the tracking mode comprises causing the first predetermined time interval to be longer than the rise time of the power amplifier output signal.

13. The method of claim 11 wherein the step of switching of the power level controller to the hold mode comprises causing the second predetermined time interval to be longer than the fall time of the power amplifier output signal.

14. The method of claim 11 wherein the step of switching the power level controller comprises operating an electric on/off switch disposed between a comparator and the power level controller.

15. The method of claim 11 wherein the step of switching the power level controller comprises switching a capacitor into and out of electrical communication with the error signal.

* * * * *